United States Patent [19]

Pasternak

[11] Patent Number: 5,394,450
[45] Date of Patent: Feb. 28, 1995

[54] CIRCUIT FOR PERFORMING ARITHMETIC OPERATIONS

[75] Inventor: John Pasternak, Fremont, Calif.

[73] Assignee: Waferscale Integration, Inc., Fremont, Calif.

[21] Appl. No.: 46,156

[22] Filed: Apr. 13, 1993

[51] Int. Cl.$^6$ .................................... H03K 21/40
[52] U.S. Cl. ........................ 377/49; 377/26; 377/28; 365/205; 365/189.12
[58] Field of Search ............ 257/739, 28; 377/49, 377/26, 39, 54; 365/189.12, 205; 307/269, 480, 465

[56] References Cited

U.S. PATENT DOCUMENTS

| | | | |
|---|---|---|---|
| 4,293,927 | 10/1981 | Hoshii | 365/222 |
| 4,473,894 | 9/1984 | Yagihashi | 365/189.12 |
| 5,124,589 | 6/1992 | Shiomi et al. | 307/475 |
| 5,229,966 | 7/1993 | Ohsawa et al. | 365/222 |

OTHER PUBLICATIONS

*Programmable System Devices PSD: Design and Applications Handbook 1990*, WSI, pp. 1-1$_1$31-2 and 4-39$_1$-34-40, Waferscale Integration, Inc.

*Primary Examiner*—Timothy P. Callahan
*Assistant Examiner*—Dinh Le
*Attorney, Agent, or Firm*—Merchant, Gould, Smith, Edell, Welter & Schmidt

[57] ABSTRACT

A race-free arithmetic operation circuit is disclosed. The circuit comprises a register file array, an arithmetic logic unit (ALU), and apparatus for controlling the input and/or the output signal of the ALU. The apparatus for controlling can be two level-sensitive latches, located before and after the ALU, or one master-slave flip-flop, located either before or after the ALU.

19 Claims, 6 Drawing Sheets

| BLOCK | REGISTER 31 | LATCH 52 | ALU 32 | LATCH 54 |
|---|---|---|---|---|
| CLOCK LOW | READ(DATA1) | OPEN(DATA1) | DATA2=F(DATA1) | LATCH(DATA?) |
| CLOCK HIGH | WRITE(DATA2) | LATCH(DATA1) | DATA2=F(DATA1) | OPEN(DATA2) |
| CLOCK LOW | READ(DATA2) | OPEN(DATA2) | DATA3=F(DATA2) | LATCH(DATA2) |
| CLOCK HIGH | WRITE(DATA3) | LATCH(DATA2) | DATA3=F(DATA2) | OPEN(DATA3) |
| CLOCK LOW | READ(DATA3) | OPEN(DATA3) | DATA4=F(DATA3) | LATCH(DATA3) |
| CLOCK HIGH | WRITE(DATA4) | LATCH(DATA3) | DATA4=F(DATA3) | OPEN(DATA4) |

CIRCUIT FOR PERFORMING ARITHMETIC OPERATIONS

FIELD OF THE INVENTION

The present invention relates to circuits performing arithmetic operations generally and to circuits performing racefree arithmetic operations in particular.

BACKGROUND OF THE INVENTION

Various counter circuits are known in the art. As shown in FIG. 1, a typical prior art counting circuit includes an N-bit counting element 10, an input register 12 and an output register 14. The counter circuit operates as follows:

a) the input register 12 stores data from a data bus 16 upon receipt of both a WRITE signal and a proper address signal from an address bus 18 (i.e. an address which indicates counting element 10);

b) the counting element 10 increases or decreases by one (1) the value of the data stored in the input register 12 and places the result in the output register 14; and c) the output register 14 provides the result to the data bus 16, via a buffer 20, upon receipt of a READ signal and a proper address signal.

Since the counting rate of the counting element 10 is determined only by the frequency of a clock (CLK) signal, counting circuits such as those shown in FIG. 1 can provide relatively high counting rates. However, when a plurality of counting circuits are implemented into an integrated circuit design, they utilize an unacceptably large area of the integrated circuit as well as consuming an unacceptably large amount of power.

A more area-efficient prior art counting circuit 28 is shown in FIG. 2 and is described in the handbook *Programmable System Devices PSD Design and Applications Handbook* 1990, pp. 4-39—4-40. Circuit 28 is operative to perform many independent counting operations and comprises a multi-port register file array 30 connected to at least one arithmetic logic unit (ALU) 32. The register file array 30 comprises M N-bit registers 31, a read address decoder 34, a write address decoder 36 and independent source and destination address lines, asrc and adst, respectively.

Circuit 28 additionally includes communication elements (not shown) with which data is provided to and received from a data bus.

It is noted that there is a circular path, labeled 38, from the register file array 30, through the ALU 32, and back to the register file array 30.

The alternative counting circuit operates as follows:

a) the read address decoder 34 decodes the register address indicated by the source address, asrc, and provides a READ signal to the indicated register, for example, register 2;

b) the ALU 32 receives the contents of the indicated register and performs the desired counting operation, providing the result back to the register file array 30; and c) the write address decoder 36 decodes the register address indicated by the destination address, adst, and provides a WRITE signal to the indicated register, thereby causing the output of the ALU 32 to be written to the indicated register. Since adst and asrc are independent, they can indicate the same or different registers.

As is known in the art, the ALU 32 typically receives no start or stop signals. Rather, it continually operates, regardless of the data which is provided to it, and it continually provides results. Thus, when the read/modify/write operations described hereinabove modify a single register and are performed within a single clock cycle, it is possible for ALU 32 to provide results to the register before the read operation finishes. The write operation will corrupt the data being read which, in turn causes the data received by the ALU 32 to be incorrect which, in turn, causes the data written into the register to be incorrect. This situation is known as a "race condition" and is highly undesirable.

The race condition is typically overcome with special circuits that carefully control the timing of the read and write signals such that the read operation finishes before the write operation ever begins. In order for this solution to operate in the face of temperature and process variations, margins must be added to the time allocated for each of the read and write operations. These margins directly add to the overall time required to execute the read/modify/write operation, resulting in a tradeoff between the risk of having a race condition occur and the speed of the operation.

A race-free operation cycle typically can be determined for a given operating frequency; however, if the circuit has to be operated at a different (slower or faster) frequency for any reason, such as when it is placed in a different environment or when it is being tested, the circuit will not operate properly.

Thus, although the register file array—ALU counting circuit utilizes less power and area, it typically operates at slower speeds than the standard logic counting circuit and is not easily incorporated into environments with different operating frequencies.

SUMMARY OF THE PRESENT INVENTION

It is therefore an object of the present invention to provide an arithmetic operation circuit which utilizes relatively little area and power and in which no race condition can occur.

There is therefore provided, in accordance with a preferred embodiment of the present invention, an arithmetic operation circuit formed of a register file array, an arithmetic logic unit (ALU) and apparatus for controlling the input and/or the output signal of the ALU.

Data from a selected register of the register file array is provided to the ALU which processes the data and returns the result to the register file array. The apparatus for controlling maintains the value of either the input or the output signal while a write or a read operation, respectively, of the register file array occurs. Because the value produced by one operation is maintained while the other operation occurs, the apparatus for controlling ensures that no race condition occurs.

In accordance with a first embodiment of the present invention, the apparatus for controlling is formed of two level-sensitive latches located before and after the ALU. The latches are sensitive to opposing levels of a control signal, such that when one latch is open, the other is closed.

In accordance with a second embodiment of the present invention, the apparatus for controlling is an edge-sensitive flip-flop, located before the ALU. The edge-sensitive flip-flop, which can be a master/slave flip-flop, latches the value of the selected register when a control signal changes from low to high. Thereafter, the flip-flop continually provides the stored data to the ALU which processes them and writes its result back into the originally selected register, or into another selected register.

In accordance with a third embodiment of the present invention, the edge-sensitive flip-flop is located after the ALU, in which case, it latches the output of the ALU.

It is noted that the first embodiment has a flexible duty cycle ranging from about 15% to about 85% while the second and third embodiments have fixed duty cycles when optimum performance is desired.

BRIEF DESCRIPTION OF THE DRAWINGS

The present invention will be understood and appreciated more fully from the following detailed description taken in conjunction with the drawings in which.

DETAILED DESCRIPTION OF A PREFERRED EMBODIMENT

In accordance with the present invention, the possibility of a race condition in a register file array—ALU circuit is removed through control of the flow of data to and/or from the ALU 32. Specifically, the data flow is controlled by temporarily storing the data at one or more points along the circular path 38.

Figure 3:
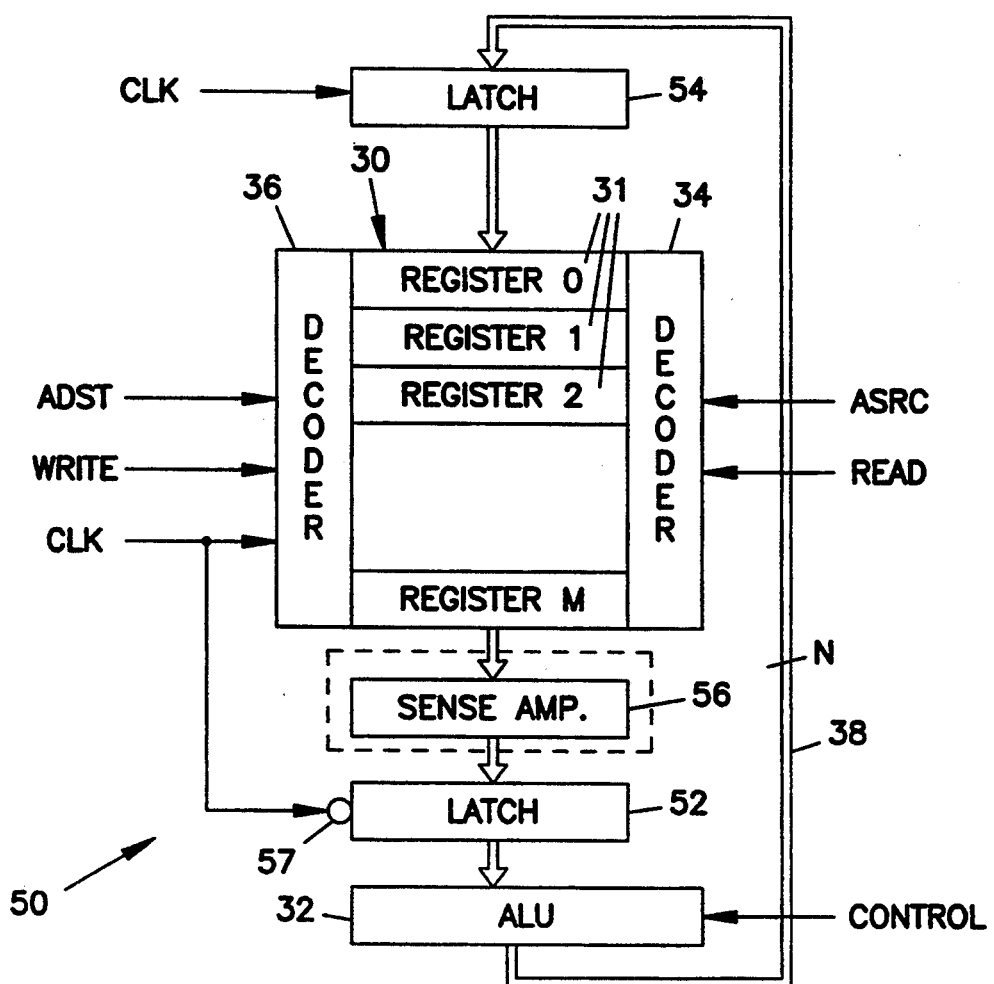
FIG. 3 is a block diagram illustration of a first embodiment of a race free counting circuit, constructed and operative in accordance with the present invention.
Figure 4:
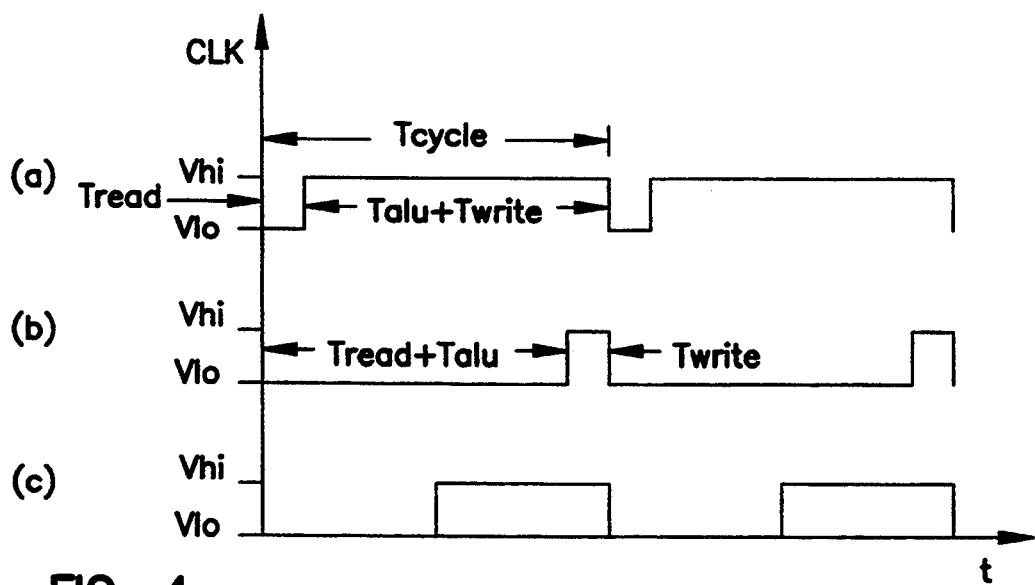
FIG. 4 is a graphical illustration of a plurality of possible timing diagrams for the counting circuit of FIG. 3.
Figures 5, 6:
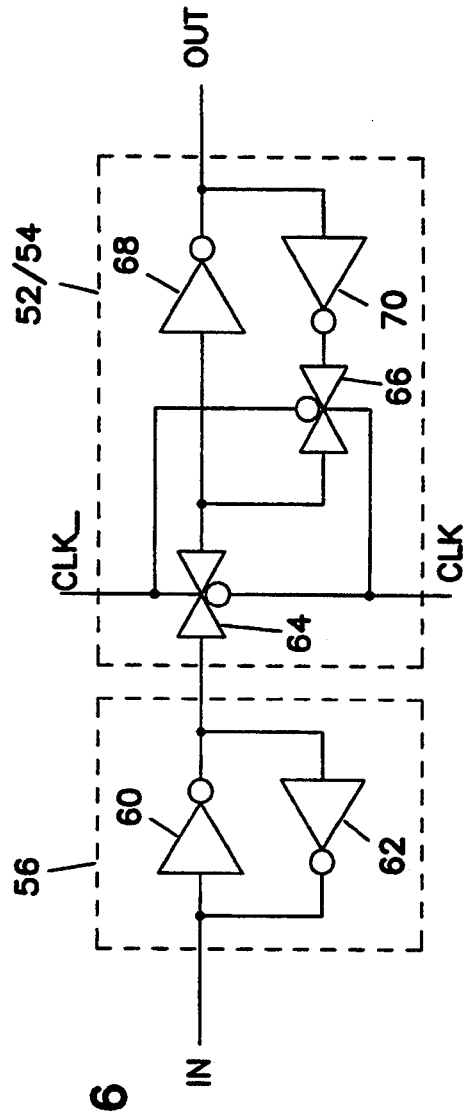
FIG. 5 is a tabular illustration of the data flow of the circuit of FIG. 3.
FIG. 6 is a schematic circuit diagram of a sense amplifier connected to a latch, useful in the counting circuit of FIG. 3.

Reference is now made to FIGS. 3–6 which illustrate an arithmetic operation circuit 50 of the present invention and its operation. FIG. 3 illustrates the circuit 50, FIG. 4 illustrates a plurality of possible timing diagrams for the circuit 50, FIG. 5 tabulates the operation of circuit 50 and FIG. 6 illustrates the elements of a sense amplifier and a latch forming part of circuit 50.

Figure 1:
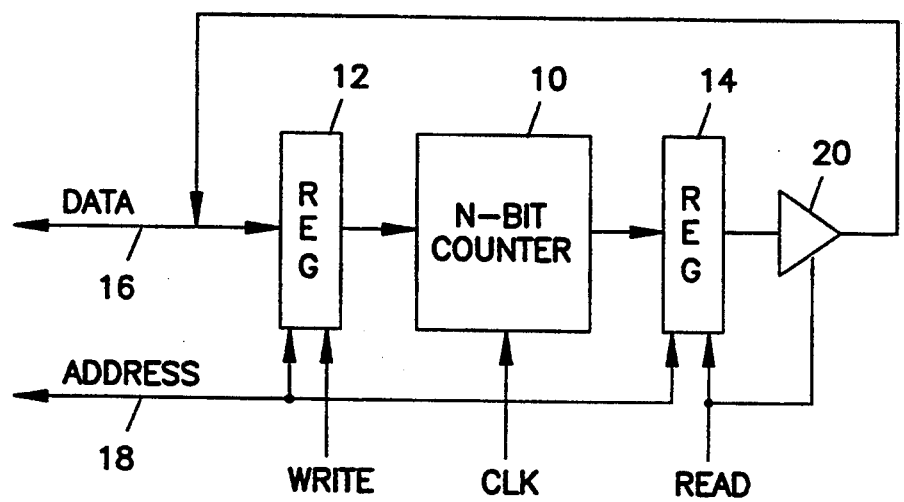
FIG. 1 is a block diagram illustration of a first prior art counting circuit utilizing an N-bit counter.
Figure 2:
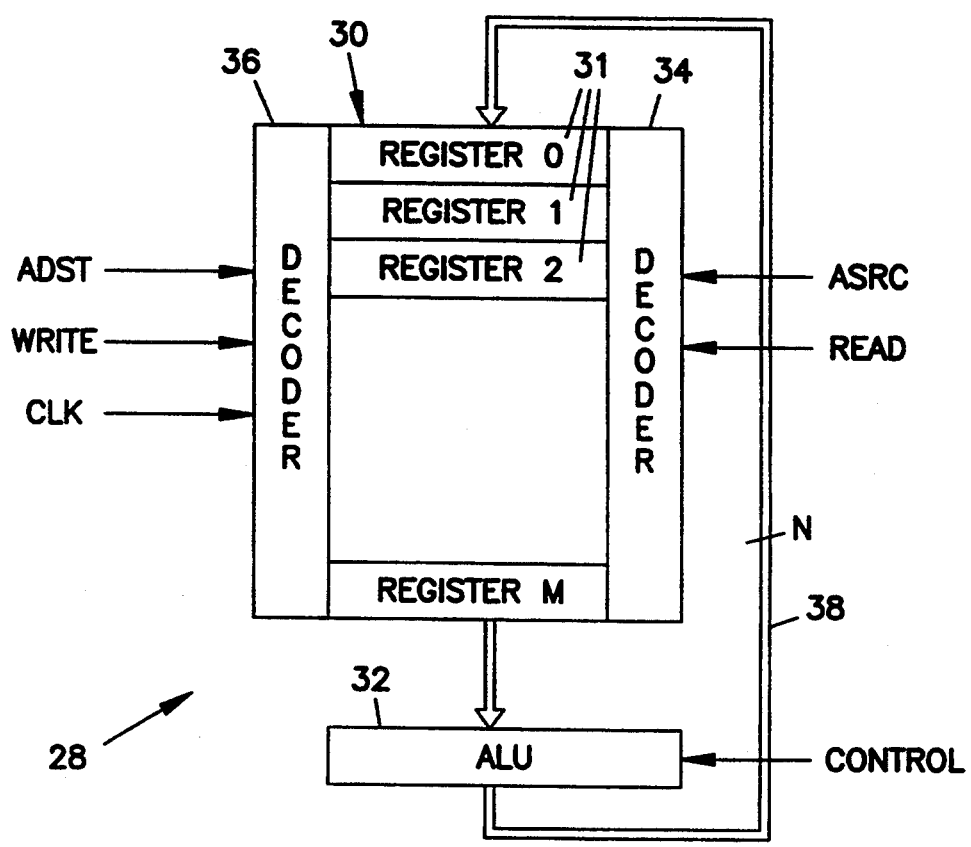
FIG. 2 is a block diagram illustration of a second prior art counting circuit utilizing a register file array and an arithmetic logic unit (ALU)

Elements of circuit 50 which are similar to those of the circuit of FIG. 2 have similar reference numerals.

Circuit 50 typically comprises the elements of circuit 28 and means for controlling data flow to the ALU 32 typically comprising first and second level-sensitive, N bit latches 52 and 54, respectively placed before and after the ALU 32. Circuit 50 typically also comprises optional sense amplifier 56 located before latch 52 for amplifying the often degraded signal from the register file array 30.

In the present invention, latches 52 and 54 can be conceived as switches, which open and close in response to a predetermined level of a control signal, such as the clock (CLK) signal, and which also store data. They are typically inversely sensitive to the level of the clock signal; for example, if latch 52 is sensitive to the low level, latch 54 is sensitive to the high level of the clock signal. An inverter 57, shown connected to latch 52, is typically utilized to invert the clock signal.

In the example given hereinabove, during the low level of the clock signal, latch 52 is "open" and latch 54 is "closed". The contents of the register 31 selected by the source address signal, asrc, flow through latch 52 to the ALU 32 which modifies them in accordance with a desired function f. The results are provided to latch 54 which, since the clock signal is low, does not allow the results to be written to the register file array 30 and, instead, maintains the value stored therein from the previous clock cycle.

During the high level of the clock signal, latch 52 is "closed" and latch 54 is "open". Therefore, the results of ALU operation flow through latch 54 and are written to the register 31 selected by the destination address signal, adst. The data being written is not provided to the ALU 32 since latch 52 is closed; instead, latch 52 maintains the value of the contents which were originally read.

It will be appreciated by those skilled in the art that the means for controlling data flow to ALU 32 prevents race conditions for all operating frequencies since the circular path 38 is never completely open for data flow.

FIG. 5 summarizes the operation of the counting circuit 50 when reading from and writing to the same register 31 over three clock cycles. In FIG. 5, Open(X) indicates that X passes through the latch and Latch(X) indicates that the latch blocks input while producing a stable copy of X on its output. Read(X) and Write(X) indicate the read and write operations, respectively, of the register. The operations indicated begin occurring once the clock signal changes state (i.e. from low to high or vice-versa). FIG. 5 is believed to be self-explanatory and therefore, in the interest of conciseness, will not be further explained herein.

It will be appreciated by those skilled in the art that in the embodiment described hereinabove, the write address decoder 36 is operative only during the high level (or register file write phase) of the clock signal. The read address decoder, on the other hand, can be operated at any time, independent of the clock level.

In the present invention, after a minimum read period, Tread, latch 52 provides ALU 32 with the correct data. ALU 32 operates on the data and provides it to latch 54, which is closed until the clock signal goes high. When the clock signal goes high and opens latch 54 (at the same time closing latch 52), the data written into the selected register will not affect the input to the ALU 32, since latch 52 is closed. Similarly, after a minimum write period, Twrite, the data stored in the selected register is correct. Therefore, the clock signal can become high at any time after the minimum read period Tread provided it stays high for at least the minimum write period Twrite.

This is illustrated in the graphs of the clock signal provided in FIG. 4. Graph (a) shows a clock signal which is low for the minimum read period, Tread, and high otherwise, graph (b) shows a clock signal which is high only for the minimum write period, Twrite, and graph (c) shows a clock signal which is low and high for approximately the same length of time. The graphs of FIG. 4 also show Tcycle, the total cycle time.

The above discussion shows that, in circuit 50, the ALU 32 operation can occur on either the low or high clock level thereby providing circuit 50 with a variable duty cycle, where duty cycle is defined as (time_clk_high)/(Tcycle). Thus, circuit 50 can operate with circuits having "unconventional" clock waveforms.

Circuit 50 was implemented in a 1.2 micron CMOS process and the various delays were estimated, using a simulator, to be:

|  |  |  |
|---|---|---|
| Tread = | 5 ns | (1) |
| Twrite = | 5 ns |  |
| Talu = | 20 ns |  |
| Tcycle = | 30 ns |  |
| Fmaxclk = | 33 MHz |  |
| Min. duty cycle = | 16% |  |
| Max. duty cycle = | 84% |  | where Fmaxclk is the maximum clock frequency.

Reference is now briefly made to FIG. 6 which schematically illustrates the elements of sense amplifier 56 and latches 52 and 54; however, the elements of the latch are connected to produce latch 52 which, in the present discussion, "opens" when the clock signal is low.

Sense amplifier 56 typically comprises two inverters 60 and 62 connected in parallel. Inverter 62 is typically flipped to the direction of inverter 60.

Latch 52 typically comprises two transmission gates 64 and 66 and two inverters 68 and 70 connected as illustrated in FIG. 6. Transmission gate 64 and inverter 68 form a forward path and transmission gate 66 and inverter 70 form a feedback path.

As illustrated, the clock signal CLK (and its inverse signal CLK_) are input into the transmission gates 64 and 66.

When the clock signal CLK is low, transmission gate 64 is open and gate 66 is closed. Therefore, transmission gate 64 passes the input signal through and inverter 68 inverts it on output. Since transmission gate 66 is closed, the inverted signal is not passed through the feedback path.

When the clock signal becomes high, transmission gate 64 is closed and transmission gate 66 is opened, thereby opening the feedback path. The value of the output is fed to inverter 70 which returns it to its original input value. The original input value is then passed by transmission gate 66 to inverter 68 which inverts it on output. As can be seen, the feedback path is a storage element, providing the output value when the transmission gate 64 is closed.

Latch 54 comprises the same elements as latch 52; however, the CLK and CLK_ signals are inverted.

It will be appreciated that the present invention provides a circuit for performing arithmetic operations (singly or multiply) without race conditions and which utilizes relatively little area and power. The present invention avoids race conditions by adding a few more elements which typically add 1-2 ns of delay to the circuit, equivalent to 3-6% of the total circuit delay. It is noted that the margins added to prior art timing signals in order to overcome process and temperature variations are at least 3-6%.

It will be appreciated that the present invention can be utilized for arithmetic operations other than counting.

Figure 7A:
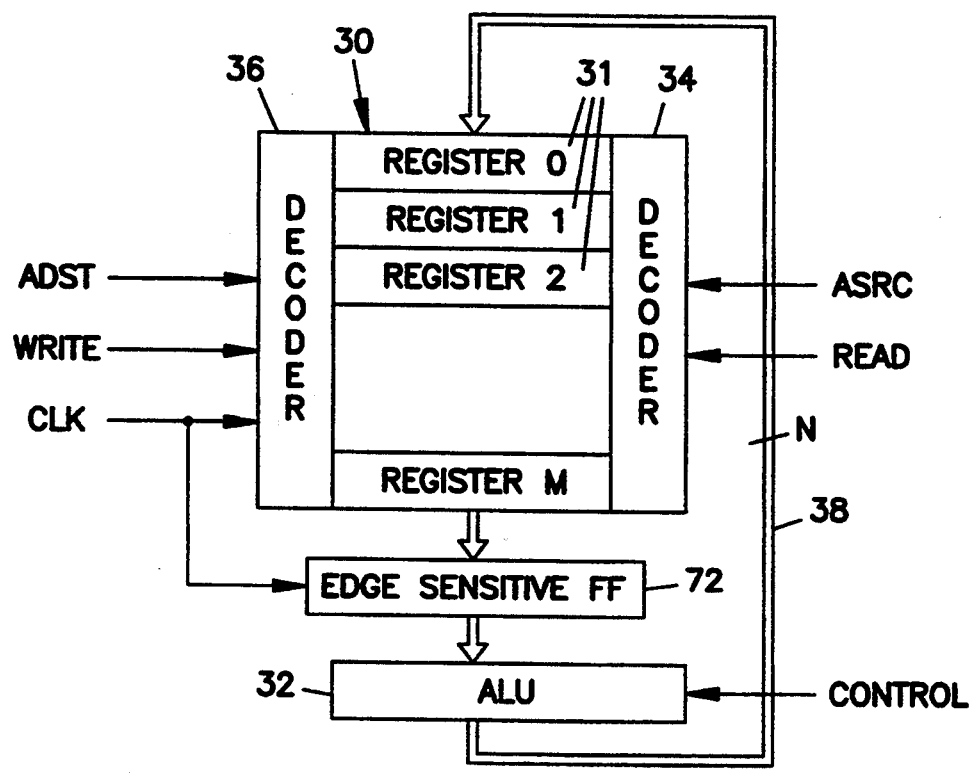
FIGS. 7A and 7B are block diagram illustrations of second and third embodiments, respectively.
Figure 8A:
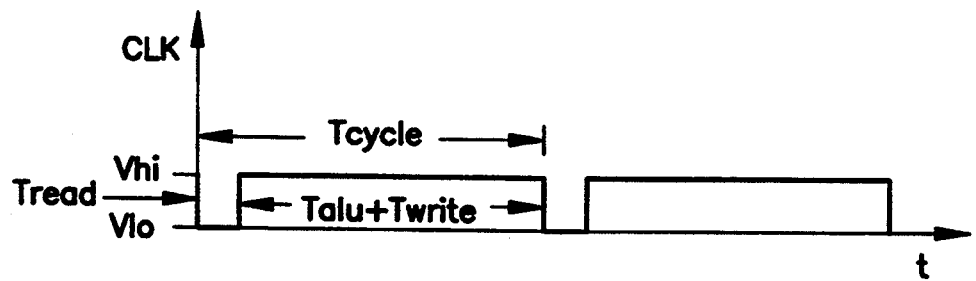
FIGS. 8A and 8B are graphical illustrations of timing diagrams for the circuits of FIGS. 7A and 7B, respectively.
Figure 7B:
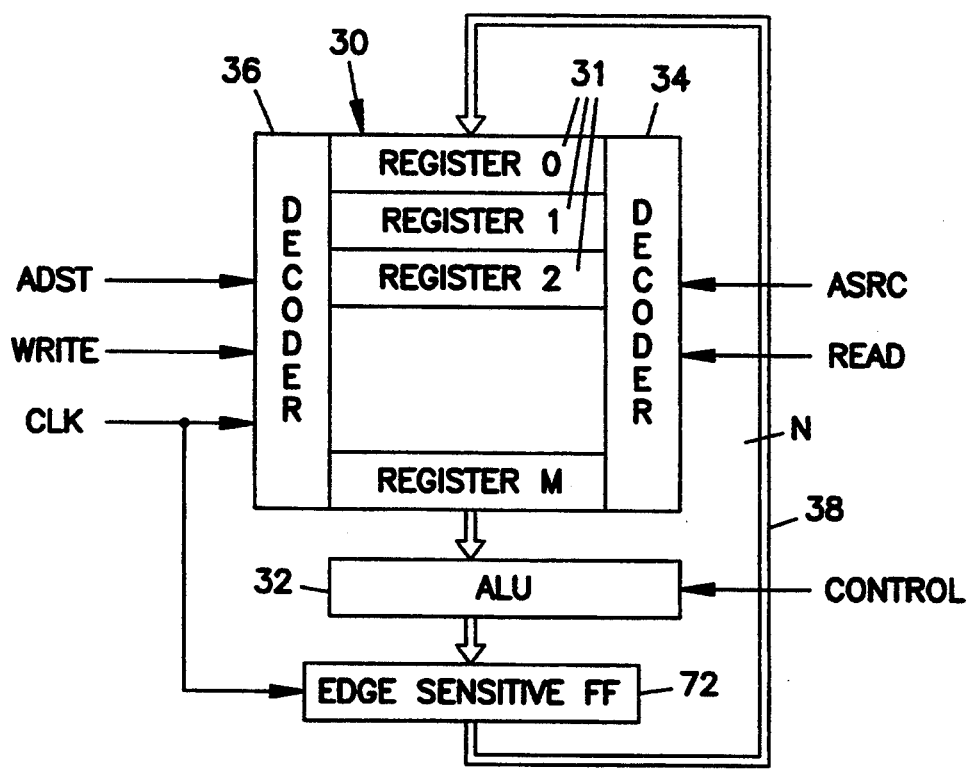
Figure 8B:
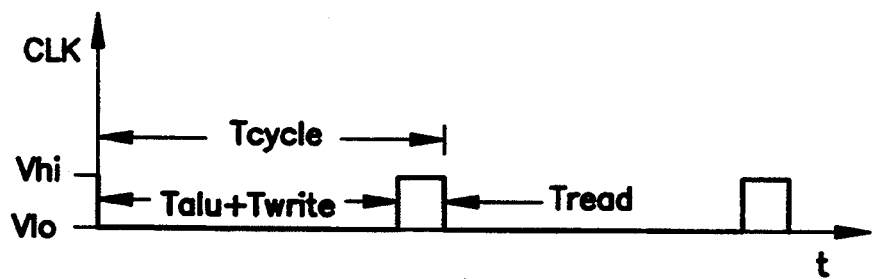

Reference is now made to FIGS. 7A and 7B which illustrate second and third embodiments of the circuit of the present invention in which the means for controlling data flow comprises as edge-sensitive flip-flop 72. Reference is also made to FIGS. 8a and 8b which provide the timing diagrams of the circuits of FIGS. 7A nd 7B, respectively. Elements of the circuits of FIGS. 7A and 7B which are similar to those of the circuits 28 and 50 have similar reference numerals.

Edge-sensitive flip-flop 72 can be a master/slave flip-flop and can be placed either before (FIG. 7A) or after (FIG. 7B) the ALU 32.

In the embodiment of FIG. 7A, when the clock changes state from high to low, data is read from the register 31 selected by the source address, asrc. When the clock changes from low to high, the flip-flop 72 latches the read data. During the high level of the clock, the flip-flop 72 provides the data stored therein to the ALU 32 which modifies the data as desired. The result is written, also during the high level of the clock, to the register 31 indicated by the destination address, adst.

Because the flip-flop 72 continually provides the original contents of the selected register 31 to the ALU 32, the result produced by the ALU 32, when written into the destination register, does not corrupt the input signal to the ALU 32, as long as the write operation finishes before the next clock edge.

An exemplary clock signal for the circuit of FIG. 7A is shown in FIG. 8A, where the read operation is shown to occur while the clock signal is low and the remaining operations occur while the clock signal is high. Because data advances through the flip-flop 72 on every low to high transition of the clock, the duty cycle of this embodiment is fixed and is a function of the reading time of the flip-flop 72. Typically, the duty cycle for optimum speed is about 90%.

In an alternate embodiment shown in FIG. 7B, the flip-flop is located after the ALU 32, in which case, the flip-flop latches the output of the ALU 32. In this embodiment, when the clock is low, the contents of the register 31 selected by the source address, asrc, are provided to the ALU 32 which modifies the data as desired and provides it to the flip-flop.

When the clock changes from low to high, the flip-flop latches the result produced by the ALU 32 and enables the result to be written back to the register file 30. The destination address, adst, selects the register 31 in which the results are written.

When the clock changes from high to low (i.e. another clock cycle), the data in the register indicated by the source address, asrc, is read and provided to the ALU 32 which modifies it. However, the result of the ALU 32 is not provided for writing until the next transition from low to high. Thus, no race condition can occur.

In this alternative embodiment as shown in FIG. 8B, the duty cycle for optimum speed is on the order of 10% rather than 90%.

It will be appreciated by persons skilled in the art that the present invention is not limited to what has been particularly shown and described hereinabove. Rather the scope of the present invention is defined only by the claims which follow:

I claim:

1. A circuit for performing arithmetic operations within one clock cycle comprising:
 a register file array having at least one individually addressable register having a datapoint stored therein;
 an arithmetic logic unit (ALU) for receiving said datapoint from said register file array, for processing said datapoint and for providing said processed datapoint to said register file array; and means, located between the register file array and the ALU, for holding only one of said datapoint and said processed datapoint at a time during a clock cycle thereby to enable said processed datapoint to be written into said individually addressable register within the same clock cycle that said datapoint is provided to said ALU without affecting an original value of said datapoint.

2. A circuit according to claim 1 and wherein said means for holding is an edge sensitive flip-flop.

3. A circuit according to claim 2 and wherein said edge sensitive flip-flop is a master/slave flip-flop.

4. A circuit according to claim 2 and wherein said edge sensitive flip-flop is located before said ALU.

5. A circuit according to claim 2 and wherein said edge sensitive flip-flop is located after said ALU.

6. A circuit according to claim 1 and wherein said means for holding comprises two level sensitive latches located before and after said register file array, wherein said level sensitive latches are active in response to opposing levels of the same cycle of a clock signal.

7. A circuit according to claim 1 and including means for reading from and writing to said register file array.

8. A circuit according to claim 7 and wherein said means for reading and writing reads from a first register and writes to a second register.

9. A circuit for performing arithmetic operations within one clock cycle comprising:
 a register file array having at least one individually addressable register;
 an arithmetic logic unit (ALU) for processing a datapoint from an addressed register of said register file array and for providing a processed datapoint to said register file array; and
 one volatile memory element located between said register file array and said ALU for holding only one of said datapoint and said processed datapoint during a clock cycle thereby to enable said processed datapoint to be written into said individually addressable register within the same clock cycle that said datapoint is provided to said ALU without affecting an original value of said datapoint.

10. A circuit according to claim 9 and wherein said volatile memory element is an edge sensitive flip-flop.

11. A circuit according to claim 10 and wherein said edge sensitive flip-flop is a master/slave flip-flop.

12. A circuit according to claim 10 and wherein said edge sensitive flip-flop is located before said ALU.

13. A circuit according to claim 10 and wherein said edge sensitive flip-flop is located after said ALU.

14. A circuit for performing arithmetic operations within one clock cycle comprising:
 a register file array having at least one individually addressable register;
 an arithmetic logic unit (ALU) for processing a datapoint from an addressed register of said register file array and for providing a processed datapoint to said register file array; and
 two volatile memory elements, respectively located before and after said register file array and active in response to opposing polarities of a clock signal for holding only one of said datapoint and said processed datapoint at a time during a clock cycle thereby to enable said processed datapoint to be written into said individually addressable register within the same clock cycle that said datapoint is provided to said ALU without affecting an original value of said datapoint.

15. A circuit according to claim 9 and including means for reading from and writing to said register file array.

16. A circuit according to claim 15 and wherein said means for reading and writing reads from a first register and writes to a second register.

17. A circuit for performing arithmetic operations and having a flexible duty cycle, the circuit comprising:
 a register file array having at least one individually addressable register;
 an arithmetic logic unit (ALU) for processing a datapoint from an addressed register of said register file array;
 first switch means for passing said datapoint from said addressed register to said ALU in response to a first polarity of a clock signal and for holding said datapoint in response to a second polarity of said clock signal; and
 second switch means for passing an output datapoint from said ALU to said addressed register in response to said second polarity of said clock signal and for holding said output datapoint in response to said first polarity of said clock signal.

18. A circuit according to claim 17 and wherein said first and second switch means are level sensitive latches.

19. A circuit according to claim 14 and wherein said volatile memory elements are level sensitive latches.

* * * * *